United States Patent [19]
Sung et al.

[11] Patent Number: 5,028,814
[45] Date of Patent: Jul. 2, 1991

[54] LOW POWER MASTER-SLAVE S/R FLIP-FLOP CIRCUIT

[75] Inventors: Chiakang Sung, Milpitas; Ronald L. Cline, Mount Sereno, both of Calif.

[73] Assignee: North American Philips Corporation, New York, N.Y.

[21] Appl. No.: 479,877

[22] Filed: Feb. 14, 1990

[51] Int. Cl.[5] .................. H03K 3/289; H03K 3/26
[52] U.S. Cl. .................. 307/272.2; 307/279; 307/291
[58] Field of Search .......... 307/272.2, 272.3, 570, 307/446, 279, 445, 452, 291, 443

[56] References Cited

U.S. PATENT DOCUMENTS

| | | | |
|---|---|---|---|
| 3,624,423 | 11/1971 | Borgini | 307/279 |
| 3,812,384 | 5/1974 | Skorup | 307/272.3 |
| 3,812,388 | 5/1975 | Southworth | 307/291 |
| 3,818,251 | 6/1974 | Hoehn | 307/272.2 |
| 4,150,392 | 4/1979 | Monaka | 307/279 |
| 4,300,060 | 11/1981 | Yu | 307/272.3 |
| 4,656,368 | 4/1987 | McCombs et al. | 307/272.2 |
| 4,680,481 | 7/1987 | Landstedel et al. | 307/279 |

OTHER PUBLICATIONS

IBM, Technical Disclosure Bulletin, vol. 20, No. 1, (1977), Race-Free Level Sensitive Master-Slave Latch Utilizing a Single Phase Clock, by D. E. Lee.

Primary Examiner—Stanley D. Miller
Assistant Examiner—Toan Tran
Attorney, Agent, or Firm—Leroy Eason

[57] ABSTRACT

A clocked S/R flip-flop having a master stage driving a slave stage. A logic signal at either a set or reset input of the maser stage charges one of a pair of capacitors respectively coupled to the outputs of a pair of FET devices respectively connected to such inputs and which are enabled during a clock pulse. The clock pulse also disables a pair of bipolar transistors respectively coupled to the outputs of the FET devices. The falling edge of the clock pulse enables the bipolar transistors, and the one which is connected to the charged capacitor produces a logic signal at the input of one of a pair of cross-coupled CMOS logic gates which constitute the slave stage. This produces a logic signal at the output of the slave stage corresponding to the binary value of the logic signal applied to the set or reset input of the master stage. The combination of bipolar and FET devices for coupling the master stage to the slave stage achieves high speed operation with minimum power consumption, and only a single series of clock pulses is required to establish clocked operation.

5 Claims, 1 Drawing Sheet

LOW POWER MASTER-SLAVE S/R FLIP-FLOP CIRCUIT

BACKGROUND OF THE INVENTION

1. Field of the Invention

The present invention relates to a master-slave S/R flip-flop circuit wherein the master stage employs capacitive storage to establish its logic state, and particularly to such a flip-flop wherein the master stage is coupled to the slave stage by an interstage coupling comprising a combination of field effect transistors (referred to herein as "FET devices") and bipolar transistors.

2. Description of the Related Art

Flip-flop circuits are an essential element of digital storage registers and memories, being capable of being switched from one to another logic state in response to a data pulse and then returned to the initial state in response to a reset pulse. Such circuits are generally clocked so that switching occurs at a rising or falling edge of an accurately timed clock pulse, such a clocked flip-flop being generally referred to as an S/R (Set/Reset) flip-flop. In order to assure that a change in input conditions occurring during the clock pulse does not produce an unpredictable result the flip-flop may comprise two stages, an input master stage and an output slave stage, the pulse being stored in the master stage and then transferred to the slave stage upon occurrence of the clock pulse. In this way the slave stage is isolated from transient changes in input conditions, thereby improving the reliability of the S/R flip-flop.

Each stage typically comprises a pair of cross-coupled logic gates, such as NAND gates or NOR gates, together with a pair of AND or NAND gates to provide clocked operation. Consequently, it is evident that a dual stage master-slave S/R flip-flop will involve considerable circuit complexity and power consumption. Considerable effort has therefore been devoted to simplifying the design of such flip-flops.

U.S. Pat. No. 3,812,388, issued May 21, 1974, discloses a dual-stage S/R flip-flop wherein in lieu of cross-coupled logic gates the input flip-flop employs the gate capacitance of each of a pair of FET devices to store an input set pulse as well as the subsequent reset pulse. However, in order to obtain clocked operation two different sequences of clock signals in interleaved phase relationship are required. U.S. Pat. No. 3,624,423, issued Nov. 30, 1971, discloses a clocked S/R flip-flop wherein the gate capacitance of each of a pair of FET devices, which control set and reset, are employed to store alternately positive and inverted clock pulse sequences. Again, two different clock pulse sequences must be provided. The article "D-type Latch" by Puri et al, *IBM Tech. Bulletin*, vol. 24, No. 8, January 1982, discloses a single stage clocked flip-flop wherein the gate capacitance of an input FET is employed to store an input data pulse and transfer it to the gate capacitance of an output FET upon occurrence of a falling edge of a clock pulse. However, such circuit does not assure stabilization of the state of the flip-flop against possible changes at the data input during a falling edge of the clock pulse.

Such prior art S/R flip-flops employ either all FET devices or all bipolar transistors, each of which technologies have advantages and disadvantages. Bipolar achieves higher speed operation, but is more complex and has relatively high power consumption. FET circuits implemented in CMOS achieve low power consumption but also have a lower operating speed. Applicants have perceived that it is possible to combine both technologies in a manner which achieves both high speed and low power consumption as well as reduced layout area on an LSI chip, and the present invention combines FET devices and bipolar transistors to provide interstage coupling of the master and slave stages.

SUMMARY OF THE INVENTION

A master-slave S/R flip-flop in accordance with the invention comprises a master stage driving a slave stage, the slave stage including a pair of cross-coupled logic gates together having a pair of input terminals and at least one output terminal at which a signal is produced having a logic value determined by which of the input terminals last received an input signal, the master stage having a set input and a reset input. The master stage includes a first FET device Q1 having an input coupled to the set input of the master stage and an output coupled to a first capacitor, and a second FET device Q2 having an input coupled to the reset input of the master stage and an output coupled to a second capacitor. A first bipolar transistor Q4 is connected at its base to the output of FET device Q1, and a second bipolar transistor Q6 is connected at its base to the output of FET device Q2, each of bipolar transistors Q4 and Q6 having a pair of current terminals. A clock pulse source is connected to the gate of each of FET devices Q1 and Q2 and also to a current terminal of each of bipolar transistors Q4 and Q6, each clock pulse enabling FET devices Q1 and Q2 and disabling bipolar transistors Q4 and Q6 during the duration of such clock pulse. Consequently, an input pulse at the set input will charge the first capacitor and an input pulse at the reset input will charge the second capacitor. Each of bipolar transistors Q4 and Q6 becomes enabled upon termination of the clock pulse, so that transistor Q4 will then supply a logic signal to a first input terminal of the slave stage if the first capacitor was charged by a reset pulse and transistor Q6 will then supply a logic signal to the second input terminal of the slave stage if the second capacitor was charged by a set pulse. The binary value of the logic signal at the output of the slave stage will therefore signify whether an input pulse was last supplied to the set input or to the reset input of the master stage.

BRIEF DESCRIPTION OF THE DRAWINGS

A more complete description of the invention is given below with reference to the accompanying drawings, wherein.

DESCRIPTION OF THE PREFERRED EMBODIMENTS

Figure 1:
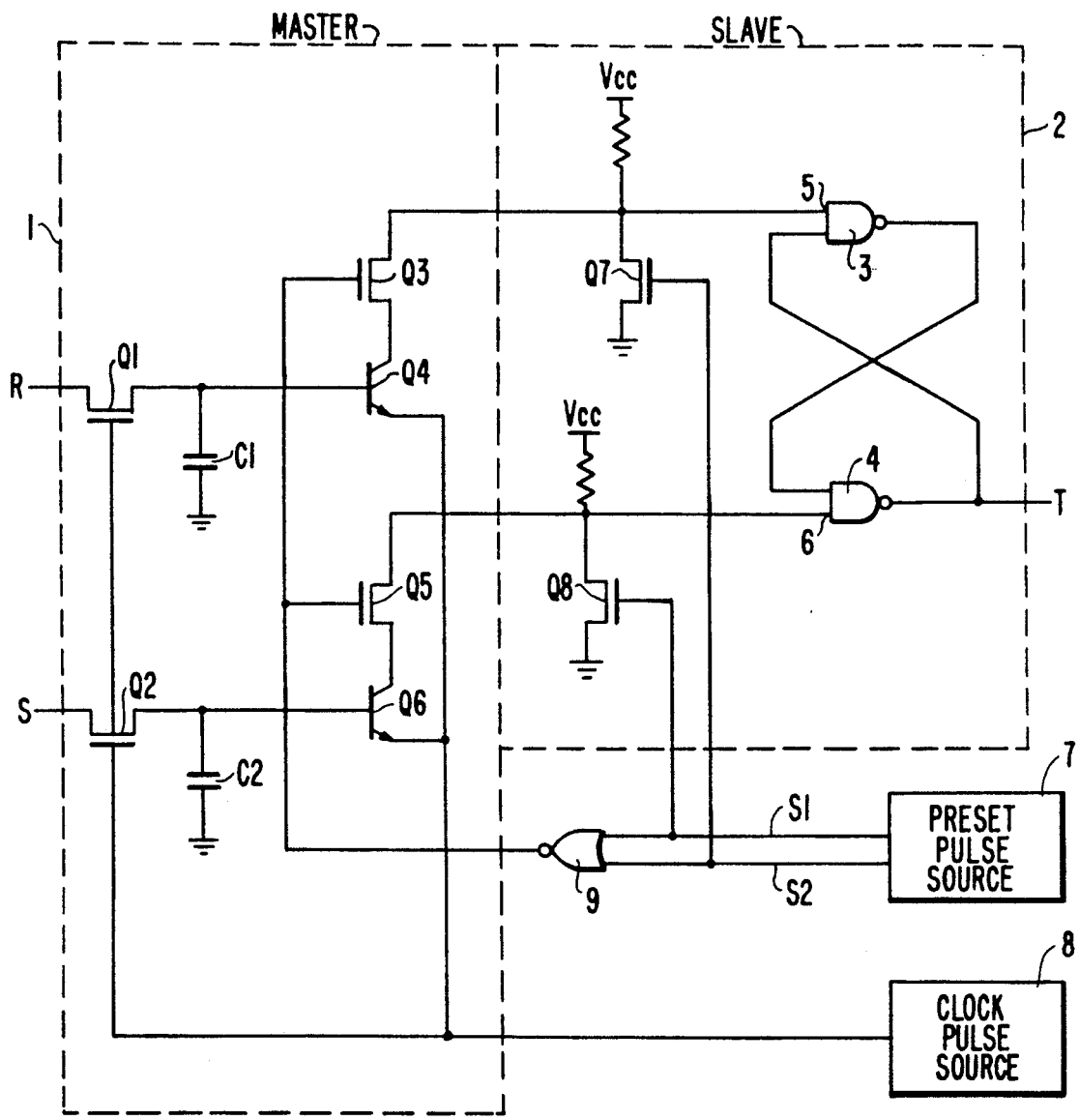
FIG. 1 is a circuit diagram of a preferred embodiment of a master-slave S/R flip-flop in accordance with the invention.

FIG. 1 is the circuit diagram of an S/R flip-flop comprising an input master stage 1 driving an output slave stage 2. Slave stage 2 comprises a pair of cross-coupled NAND gates 3 and 4, the output T of gate 4 being the output of the entire circuit and being high when the flip-flop stores a logic "1" and being low when it stores a logic "0". NAND gates 3 and 4 are each preferably realized with CMOS devices, a conventional form of such a NAND gate being shown in FIG. 2. In the ensuing description it will be assumed that positive logic is employed, whereby a high voltage level represents a logic "1" and a low voltage level represents a logic "0". It will be obvious to those skilled in the art that negative logic could equally well be employed with appropriate signal inversions. In addition, although the circuit as described employs N channel FET devices and NPN bipolar transistors, it will be obvious to those skilled in the art that P channel FET devices and PNP bipolar transistors could equally well be employed with reversal of the described polarities of the power-supply source and pulse sources.

Figure 2:
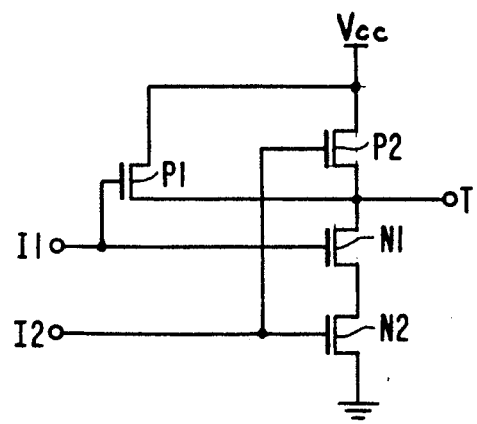
FIG. 2 is a circuit diagram of a conventional CMOS NAND gate such as may be employed in the slave stage of the flip-flop of FIG. 1.

In FIG. 2 a pair of N channel FET devices N1 and N2 are connected in series between ground and output terminal T, the source of N2 being grounded and the drain of N1 being connected to the terminal T. A pair of P channel FET devices P1 and P2 are connected in parallel between terminal T and a source of positive supply voltage $V_{cc}$. The gates of P1 and N1 are both connected to a first input terminal I1 and the gates of P2 and N2 are both connected to a second input terminal I2. It will be apparent that if either or both of the signals at inputs I1 and I2 are a logic "0", a logic "1" will be produced at output terminal T, and that if both of the signals at inputs I1 and I2 are "1" then N1 or N2 or both will conduct and a "0" will be produced at output terminal T.

Returning to FIG. 1, in slave flip-flop 2 a pair of N channel FET inverters Q7 and Q8 are respectively coupled to the logic input terminals 5, 6 of NAND gates 3 and 4, the gates of Q7 and Q8 being respectively connected to respective ones of a pair of alternate outputs S1 and S2 of a preset pulse source 7 which is controllable to produce a series of pulses on either of its outputs. A preset pulse at output S1 will turn on inverter Q8, producing a "0" at input 6 of NAND gate 4 and a "1" at output T. Since inverter Q7 is off in the absence of a gate pulse, both inputs of NAND gate 3 are "1" and result in a "0" output therefrom which is cross-coupled to the remaining input of NAND gate 4. The preset pulse on S1 thus causes the slave flip-flop 4 to be set to an initial "1" state regardless of its previous state. The effect of a preset pulse on S2 has the same but inverted result, setting NAND gate 3 to the "1" state and NAND gate 4 to the "0" state, so that output terminal T will be at logic "0". Thus, the initial state of slave flip-flop 2, prior to data storage operation, can be selectively set to either "0" or "1" by setting preset pulse source 7 to either of its outputs S1 and S2.

The master flip-flop 1 has a reset terminal R and set terminal S respectively connected to the inputs of N channel FET devices Q1 and Q2, the gates of which are connected to a clock pulse source 8 producing clock pulses which are asynchronous with the preset pulses produced by preset pulse source 7. The clock pulses may be in the form of a square wave between ground and a higher voltage level. At the positive edge of a clock pulse FET devices Q1 and Q2 will be rendered conductive, so that if a logic "1" then exists at input terminal R it will be stored as a charge on capacitor C1 coupled to the output of FET device Q1. Similarly, if a logic "1" exists at input terminal S it will be stored as a charge on capacitor C2 coupled to the output of FET device Q2. The output of Q1 is connected to the base of an NPN bipolar transistor Q4, and the output of Q2 is connected to the base of another NPN bipolar transistor Q6. The emitters of Q4 and Q6 are connected to clock pulse source 8. The collector of Q4 is coupled to the input terminal 5 of slave flip-flop 2 by an N channel FET device Q3, and the collector of Q6 is coupled to input terminal 6 of slave flip-flop 2 by another N channel FET device Q5. The gates of Q3 and Q5 are connected to the output of a NOR gate 9, preferably of CMOS construction, which receives as inputs the preset pulses on outputs S1 and S2 of preset pulse source 7. NOR gate 9 maintains Q3 and Q5 conductive except during a preset pulse, so that Q3 and Q5 effectively disconnect master stage 1 from slave stage 2 whenever a preset pulse is supplied to slave stage 2. This assures that slave flip-flop 2 will be preset to a predetermined reference state independently of the condition of master flip-flop 1.

During a clock pulse bipolar transistors Q4 and Q6 are held off, so that a logic input signal at terminal R or S will charge the relevant one of capacitors C1 and C2. Assume that capacitor C1 is charged due to a reset logic "1" at input terminal R, and that slave flip-flop 2 has already been preset to the "0" state. At the negative-going edge of the clock pulse bipolar transistor Q4 will be rendered conductive and produces a logic "0" at input 5 of gate 3 in slave flip-flop 2. The resulting "1" at the output of gate 3 is cross-coupled to gate 4, the input terminal 6 of which is already at "1" since FET device Q8 is off. A "0" is therefore produced at output terminal T of slave flip-flop 2. Thus, the reset pulse at input terminal R of master flip-flop 1 causes slave flip-flop 2 to switch to the "0" state.

If subsequently a set pulse is applied to input terminal S of master flip-flop 1, a rising edge of the next clock pulse will turn on Q2 and capacitor C2 will be charged. The succeeding falling edge of the clock pulse will cause transistor Q6 to turn on, and via transistor Q5 (which is already on) produces a "0" at input terminal 6 of NAND gate 4 in slave flip-flop 2. A "1" is thereby produced at output terminal T, and is cross-coupled to gate 3. Since input terminal 5 of gate 3 is already at "1", a "0" is produced at the output thereof. Thus, a set pulse at input terminal S of master flip-flop 1 causes slave flip-flop 2 to switch to the "1" state.

It should be noted that the clock pulses enable Q1 and Q2 and disable Q4 and Q6, thus effectively disconnecting the slave flip-flop 2 from master flip-flop 1 during the interval in which a change of state of master flip-flop 1 is occurring. In addition, termination of a clock pulse disables Q1 and Q2 and enables Q3 and Q4, so that during transfer of a logic state from master flip-flop 1 to slave flip-flop 2 any pulses occurring at either input terminal R or input terminal S are effectively isolated from master flip-flop 1. In this way, highly reliable operation of the complete S/R flip-flop is maintained even under adverse circuit conditions. Also to be noted is that bipolar transistors Q4 and Q6 are in the off condition except for the brief interval during which a set or reset pulse exists at input R or S, thereby minimizing power consumption while at the same time providing strong power gain for the voltage developed by the capacitors C1 and C2. Still another feature of the circuit of FIG. 1 is that only a single series of clock pulses is required in order to provide clocked operation.

While the invention has been described in terms of preferred embodiments thereof, it will be apparent to those skilled in the art that various adaptations and modifications thereof may be made without departing from the true teachings and scope of the invention as set forth in the ensuing claims. For example, as noted above, with minor modifications of the circuit PNP bipolar transistor could be employed in lieu of NPN bipolar transistors, and P channel FET devices could be employed in lieu of N channel FET devices.

What is claimed is:

1. A clocked S/R flip-flop comprising a master stage driving a slave stage, the slave stage including a pair of cross-coupled logic gates which together have a pair of input terminals and at least one output terminal at which a logic signal is produced having a binary value determined by which of said input terminals last received a logic signal, the master stage having a set input and a reset input for receiving input logic signals; characterized in that the master stage comprises:
   a first FET device (Q1) having a gate and a pair of current terminals a first of which is coupled to the reset input of the master stage and a second of which is coupled to a first capacitor, and a second FET device (Q2) having a gate and a pair of current terminals a first of which is coupled to the set input of the master stage and a second of which is coupled to a second capacitor;
   a first bipolar transistor (Q4) having a base connected to said second current terminal of FET device (Q1) and a second bipolar transistor (Q6) having a base connected to said second current terminal of FET device (Q2), each of bipolar transistors (Q4) and (Q6) further having an emitter and collector constituting a pair of current terminals thereof;
   a clock pulse source connected to the gate of each of FET devices (Q1) and (Q2) and further connected to a first current terminal of each of bipolar transistors (Q4) and (Q6), each clock pulse enabling FET devices (Q1) and (Q2) and disabling bipolar transistors Q4 and Q6, whereby a logic signal at said set input will cause a charge to be stored on said first capacitor and a logic signal at said reset input will cause a charge to be stored on said second capacitor; and
   means for coupling a second current terminal of each of bipolar transistors (Q4) and (Q6) respectively to said first and second input terminals of said slave stage;
   each of bipolar transistors (Q4) and (Q6) becoming enabled upon termination of clock pulse at said first current terminal thereof, so that bipolar transistor (Q4) then supplies a logic signal to said first input terminal of said slave stage if said first capacitor has been charged and transistor (Q6) then supplies a logic signal to said second input terminal of said slave stage if said second capacitor has been charged, whereby the binary value of the logic signal at the output of said slave stage is determined by whether an input logic signal was last received as said set input of said master stage or was last received at said reset input thereof.

2. A clocked S/R flip-flop as claimed in claim 1, wherein said means for coupling the second current terminal of each of bipolar transistors (Q4) and (Q6) respectively to said first and second input terminals of said slave stage comprises a third FET device (Q3) and a fourth FET device (Q5), said third FET device (Q3) coupling said second current terminal of bipolar transistor (Q4) to said first input terminal of said slave stage and said fourth FET device (Q5) coupling said second current terminal of bipolar transistor (Q6) to said second input terminal of said slave stage; and further comprising presetting means for disabling FET devices (Q3) and (Q5) for intervals during which the logic signal at the output of said slave stage is to be preset to a predetermined logic value.

3. A clocked S/R flip-flop as claimed in claim 2, wherein said presetting means comprises: means for coupling a source of preset pulses to at least one of said input terminals of said slave stage; and inverter means for coupling said source of preset pulses to the gates of FET devices (Q3) and (Q5); whereby a preset pulse disables FET devices (Q3) and (Q5) and thereby decouples bipolar transistors (Q4) and (Q6) from said slave stage, and also presets said slave stage to produce a predetermined logic signal at the output thereof.

4. A clocked S/R flip-flop as claimed in claim 3, wherein said means for coupling said source of preset pulses to at least one input terminal of said slave stage is an FET device (Q7) or (Q8) the gate of which is connected to said source of said preset pulses and having a current terminal which is connected to said one of the input terminals of said slave stage.

5. A clocked S/R flip-flop as claimed in claim 1, wherein said logic gates of said slave stage comprise CMOS devices.

* * * * *